United States Patent [19]

Asahi et al.

[11] Patent Number: 4,486,462
[45] Date of Patent: Dec. 4, 1984

[54] METHOD FOR COATING BY GLOW DISCHARGE

[75] Inventors: Naotatsu Asahi, Katsuta; Shizuka Yamaguchi; Yoshitaka Kojima, both of Hitachi; Katsuyoshi Terakado, Mito, all of Japan

[73] Assignee: Hitachi, Ltd., Tokyo, Japan

[21] Appl. No.: 377,419

[22] Filed: May 12, 1982

[30] Foreign Application Priority Data

May 13, 1981 [JP] Japan .................................. 56-70819

[51] Int. Cl.³ .............................................. B05D 3/06
[52] U.S. Cl. ........................................ 427/39; 148/16; 148/16.5; 148/16.6
[58] Field of Search ....................... 118/723, 501, 730; 427/39; 148/16, 16.5, 16.6

[56] References Cited

U.S. PATENT DOCUMENTS 3,190,772 6/1965 Berghaus et al. ................... 148/16.6

FOREIGN PATENT DOCUMENTS

146964 3/1981 Fed. Rep. of Germany ........ 427/39

Primary Examiner—Evan K. Lawrence
Attorney, Agent, or Firm—Antonelli, Terry & Wands

[57] ABSTRACT

A gaseous compound of a metal species or a semi-metal species is reacted with another gaseous substance capable of reacting with the gaseous compound of the metal or semi-metal species under a total pressure of not more than 10 Torr, where the partial pressure of the gaseous compound is not more than that of the gaseous substance, the reacting being carried out by the glow discharge generated between an electroconductive workpiece connected to a cathode, at least one secondary cathode provided at a position near enough to the workpiece to generate interactions of glow discharge between at least selected portions of the workpiece and the at least one secondary cathode, and an anode, thereby coating the at least selected portions of the workpiece with the resulting reaction product containing the metal or semi-metal species.

17 Claims, 25 Drawing Figures

FIG. 17

METHOD FOR COATING BY GLOW DISCHARGE

BACKGROUND OF THE INVENTION

This invention relates to a method for coating by glow discharge, and more particularly to a method for coating at least selected portions of the surface of an electroconductive workpiece with a reaction product containing a metal species or a semi-metal species by the glow discharge generated between the electroconductive workpiece connected to a cathode, at least one secondary cathode provided at a position near enough to the workpiece to generate interactions of glow discharge between at least selected portions of the workpiece and the at least one secondary cathode, and an anode.

The conventional method for coating an electroconductive workpiece includes a chemical vapor deposition (CVD) process and a physical vapor deposition (PVD) process and has been so far applied to coating with TiC and TiN. For example, according to the CVD process, for example, a workpiece, as heated to about 1,000° C. in an electric furnace or by high frequency heating, is coated with TiC formed by catalytic reaction of the workpiece surface with a gas phase, for example, $TiCl_4$ and $C_3H_8$ in a gaseous state. The process of depositing the reaction product is a process of solid crystal growth on a workpiece from a gas phase, where there are differences in temperatures and concentrations of chemical species between the workpiece and the gas phase, and the degree of supersaturation is a driving force for a film growth. Thus, in the CVD process, the diffusion of gaseous reactants into a reaction boundary is based on a gaseous diffusion, and thus generally the concentrations of gaseous reactants at the boundary are low. In coating with TiC according to the CVD process, a film as thick as about 5–10 $\mu$m is formed by coating at about 1,000° C. for 2 to 3 hours, and thus a film-forming speed is low in spite of the high temperature. In order to form a film with stable characteristics, it is necessary to make fine control of mixing ratio, flow rate, etc. of gaseous reactants, and thus the coating process is complicated. Furthermore, such a high temperature as about 1,000° C. is required, so that, when the workpiece is a most popular steel part, such deteriorations as embrittlement due to growth of coarse crystal grains, etc. are brought about. Their prevention needs complicated steps. Similar disadvantages also appear in the PVD process. In the PVD process, coating can be made at a low temperature, but decrease in adhesiveness of a film to a workpiece, decrease in film-forming speed, etc. appear as disadvantages in that case.

Coating of TiC by glow discharge has been disclosed [for example, F. J. Hazlewood and P. C. Iordanis. "Abrasion-resistant, titanium-carbide-based coatings formed by glow-discharge-assisted vapor deposition", paper 12, pages 29–37, Advances in Surface Coating Technology, International Conference of the Welding Institute and the Institute of Mechanical Engineers, London, Feb. 13–15 ('78)].

The disclosed coating method provides coating by glow discharge using an ionized gas, where $TiCl_4$ is used as a gas source, and a film of TiC is formed from $TiCl_4$ and $C_2H_2$ as gaseous reactants and $Ar+5\%$ $H_2$ as a carrier gas in a container under a reduced pressure of at least $10^{-1}$ Torr. Heating of workpiece is carried out by glow discharge energy, requiring no outside heat source. That is, the glow-generating surface itself is a heating source, and thus the temperature of a workpiece depends upon a proportion of surface area to volume of the workpiece. In other words, workpieces of identical, rather simple configurations can take a substantially uniform temperature distribution throughout the workpieces, and can undergo uniform coating, but workpieces having complicated configurations, particularly different proportions of surface area to volume, though the configurations are identical with one another, have local differences in ion collision energy and ionization density, making a temperature difference larger, and thus the concentration and depth of diffused atoms are widely fluctuated, giving a change to the film-forming speed. That is, uniform coating cannot be obtained. Particularly in workpieces with irregularity in configuration, glow discharge is concentrated at protruded parts that are liable to emit electrons, and thus the protruded parts are selectively coated with substantial failure to coat the recess parts.

These phenomena greatly depend upon discharge voltage at the glow discharge. That is, heating to higher than 600° C. by glow discharge will rapidly increase the discharge voltage. The higher the discharge voltage, the more limited the direction of discharging electrons. That is, the glow discharge will be concentrated at positions that are more liable to emit electrons.

Furthermore, the difference in temperature is increased with increasing temperature, but the difference is not so remarkable at the now commercially applicable ion nitriding temperature of 600° C., and thus there is no problem in the nitriding at that temperature. However, even in the nitriding at a high temperature, the difference in temperature becomes larger, and it is difficult to uniformly treat the desired portions of workpieces. To solve these problems, it has been proposed, for example, to carry out ion nitriding in the conventional vacuum heat-treating furnace or to conduct ion nitriding while using an outside high frequency heating. However, in the former case, heating of a workpiece is carried out by a heater such as carbon fiber heater, requiring a heat-treating power source of higher output with consequent reduction in heating by ions. That is, the ion collision energy to a workpiece will be less than in the conventional treatment only by ions, and the proportion of ion distribution to the surface of a workpiece is reduced. Consequently, the structure and control of a treating apparatus will be complicated, and total consumption energy will be increased, with a resulting reduction in concentration in atoms that take part in cleaning action by ions, film formation or hardening on the surface, etc.

In the latter case, when many workpieces are placed in a furnace for heating by induced current by high frequency, the individual workpieces have different heating temperatures, depending upon distances from the high frequency coil, and also the power source and control will be complicated as in the former case. Furthermore, the energy for the treatment is increased and the cleaning action by ions and control of ions on the surfaces of workpieces cannot be attained fully.

On the other hand, the entire workpiece is not always subjected to surface treatment of single function, but may be subjected to surface treatment of a plurality of functions within one and same workpiece, depending upon the intended application of the workpiece. In such treatment, the said ion surface treatment has not been carried out continuously in one and same furnace in one step, but has been carried out in a complicated process.

As a method of obtaining locally differently treated layers on a workpiece by ion-treating (for example, in different depths and hardness), an ion surface-treatment process is disclosed in the Japanese patent application Laid-Open No. 6956-1972 wherein an additional metal electrode (which forms an anode with respect to the workpiece) is inserted between the workpiece (cathode) and the wall of the vacuum container (anode) and is connected through a potentiometer to the positive terminal of the dc power supply so that changing the potential of the metal electrode by means of the potentiometer will partially vary the ion collision energy. With the process of e.g. ion nitriding, the additional metal electrode is provided in the vicinity of the desired portion of a workpiece which is to have a different nitriding layer, so that a change in potential of the metal electrode by means of the external circuit will provide a change in the ion collision energy at the desired portion to control the amount of nitrogen atoms that tend to diffuse into the portion, thereby forming a partially different nitrided layer. Since the nitrogen diffusion depends greatly on temperature, not on the ion collision energy in the case of such a method of changing the ion collision energy, it is greatly difficult to change the depth of the nitrided layer partially.

To solve these problems, the present inventors developed a process for carrying out the necessary surface treatment under a lower discharge voltage for a short period of time by providing a secondary cathode at a position near enough to an electroconductive workpiece to generate interactions of glow discharge between selected portions of the electroconductive workpiece and the secondary cathode, and generating glow discharge so as to cause the interactions between selected portions of the workpiece and the secondary cathode, thereby making the glow discharge voltage at the surface of the workpiece lower [U.S. patent application Ser. No. 174,748 filed Aug. 4, 1980, now U.S. Pat. No. 4,394,234, German Laid-open Application (DOS) No. 3,029,339]. That is, the prior art process provides a surface treatment process wherein glow discharge is established between a cathode and an anode of a power source to carry out heat treatment of a workpiece under a reduced pressure condition in a container, comprising the steps of placing the workpiece which has a conductive surface and which is electrically connected to the cathode in said container, positioning a secondary electrode which has a conductive surface and which is electrically connected to the cathode close to a selected treatment portion of said workpiece, and effecting a glow discharge between the conductive surfaces of said workpiece and the secondary electrode and said anode; the distance between the workpiece and the secondary electrode being selected to increase the surface temperature of the selected treatment portion of said workpiece and to increase the heat treatment effect on said selected treatment portion of said workpiece.

The present inventors have made extensive studies of applying a CVD process to the said surface treatment process as a series research and have established the present invention.

SUMMARY OF THE INVENTION

An object of the present invention is to provide a method for uniformly coating the entire surface or selected portions of an electroconductive workpiece under a low voltage by glow discharge with or without surface pretreatment of the workpiece.

The present invention provides a method for coating an electroconductive workpiece by glow discharge, which comprises reacting a gaseous compound of a metal species or semi-metal species with another gaseous substance capable of forming a reaction product containing the metal or semi-metal species by reaction with the gaseous compound of the metal or semi-metal species under a total pressure of not more than 10 Torr, and the partial pressure of the gaseous compound being not more than that of the gaseous substance, the reacting being carried out by the glow discharge generated between an electroconductive workpiece connected to a cathode, at least one secondary cathode provided at a position near enough to the workpiece to generate interactions of glow discharge between at least selected portions of the workpiece and the at least one secondary cathode, and an anode, thereby coating said at least selected portions of the workpiece with the resulting reaction product.

The term "gaseous compound of a metal species or a semi-metal species" will be hereinafter referred to as "gaseous reactant of metal species" or semi-metal species, the term "another gaseous substance capable of forming a reaction product containing the metal species or semi-metal species by reaction with the gaseous compound of metal species" as "counterpart gaseous reactant", and both together as "gaseous reactants". Moreover, the term "reaction product containing metal or semi-metal species" will be hereinafter referred to as "reaction product containing the metal species".

Furthermore, the present invention uses an apparatus for coating an electroconductive workpiece by glow discharge, which comprises an anode, a cathode, an electroconductive workpiece connected to the cathode, at least one secondary cathode provided at a position near enough to the workpiece to generate interactions of glow discharge between at least selected portions of the workpiece and the at least one secondary cathode, an inlet and an outlet for gaseous reactants, and a pressure-controlling means.

According to the present invention, an electroconductive workpiece connected to a cathode is provided in an atmosphere comprising a gaseous reactant of metal species and a counterpart gaseous reactant under a reduced pressure, and further a secondary cathode is provided around the workpiece at a position near enough to the workpiece to generate interactions of glow discharge, that is, the so called hollow-cathode effect, between the workpiece and the secondary cathode, and reacting the gaseous reactant of metal species with the counterpart gaseous reactant by the glow discharge generated between the workpiece, the secondary cathode and an anode, thereby coating at least selected portions of the workpiece with the reaction product containing the metal species.

The hollow-cathode effect is defined in the said U.S. Pat. No. 4,394,234 (DOS No. 3,029,339). That is, the present inventors call interactions a hollow-cathode effect which is found in a hollow cathode of a hollow cathode tube for use in an atomic absorption analyzer. At that portion of the workpiece which faces the secondary cathode, the ionization concentration of the gas will increase and active diffusion atoms will correspondingly act on the workpiece surface.

The glow discharge treatment can be effectively carried out by providing the secondary cathode so as to substantially surround the selected portions of the workpiece, where the substantial surrounding includes substantially complete surrounding of the selected portions of the workpiece with the secondary cathode as well as relative movement or rotation of the selected portions of the workpiece and the secondary cathode to obtain the same effect as by the substantial surrounding. Furthermore, the glow discharge treatment can be effectively carried out also by providing a plurality of secondary cathodes to attain the hollow discharge effect between the secondary cathodes or between the secondary cathodes and the workpiece provided inside the secondary cathodes.

The secondary cathode is to generate interactions of glow discharge, that is, the hollow cathode effect, between selected portions of the workpiece and the secondary cathode provided at a position near enough to the selected portions of the workpiece to generate the interactions, whereby a gaseous reactant of metal species is made to react with a counterpart gaseous reactant to form the resulting reaction product containing the metal species onto the selected portions of the workpiece as a film. The secondary cathode is a secondary energy source for the glow discharge, and the reactants are supplied from the atmospheric gas, where the gaseous reactant of metal species is supplied under a total pressure of not more than 10 Torr. In other words, the partial pressure of the gaseous reactant of metal species is so low, that is, it is supplied at a very low concentration. The gaseous reactant of metal species at such a very low concentration must be supplied so that a fresh gaseous reactant of metal species can be always uniformly and continuously distributed to the surface of a workpiece through the clearance between the secondary cathode and the workpiece, and it is also necessary to deposit the reaction product containing the metal species onto the selected portions of a workpiece without any stagnation of the gaseous reactant of metal species or the reaction product containing the metal species in the clearance.

As a result of extensive studies to solve these problems, the present inventors have found the following facts.

When the gaseous reactant of metal species is supplied in a smaller amount, the film-forming speed of the reaction product containing the metal species is made lower, whereas when the gaseous reactant of metal species is supplied in a larger amount, the film-forming speed is made larger, but the resulting film becomes porous and brittle and also more liable to peel off the workpiece.

For example, when $TiCl_4$ is used as a gaseous reactant of metal species and $CH_4$ as a counterpart gaseous reactant, and when the partial pressure of $TiCl_4$ is more than 0.5 Torr, and the partial pressure of $CH_4$ is less than the partial pressure of $TiCl_4$ that is, less than 0.5 Torr, fine reaction product particles deposit as an accumulated mass on the surface of a workpiece and take a foil shape after 20 to 30 minutes, and peel off the workpiece. Microscopic observation of the cross-section of the film on the workpiece reveals that substantially no TiC is formed. It has been found desirable that the partial pressure of $TiCl_4$ is not more than 0.5 Torr and the partial pressure of $CH_4$ is not less than the partial pressure of $TiCl_4$, that is, 0.5 Torr.

The gaseous reactant of metal species is continuously supplied into an apparatus for coating by the glow discharge at one end while exhausting at another end. Particularly, the gaseous reactant of metal species is continuously supplied into a clearance between a secondary cathode and a workpiece, particularly at least onto the selected portions of a workpiece under a total pressure of not more than 10 Torr, and a partial pressure of the gaseous reactant of metal species of not more than 0.5 Torr and that of the counterpart gaseous reactant of not less than 0.5 Torr. The gaseous reactant of metal species can be supplied as dispersed in a carrier gas, and reacts with a counterpart gaseous reactant by glow discharge generated between the secondary cathode and the workpiece, and the resulting reaction product containing the metal species deposits onto the surface of the workpiece. The concentrations of gaseous reactants existing in the glow discharge zone are reduced in accordance with the progress of reaction. When the apparatus for coating by glow discharge has such a structure as to cause stagnation of the gaseous reactants, the gaseous reactants adjusted to appropriate partial pressures for the glow discharge reaction cannot be uniformly distributed, failing to form uniform coating on the surface of a workpiece. It has been found necessary to make the clearance between the secondary cathode and the workpiece have open upper and lower ends and make relative movement of the supply direction of gaseous reactants, particularly gaseous reactant of metal species, and a workpiece during the reaction to obtain uniform distribution of gaseous reactants and uniform coating on the workpiece. To this end, a workpiece or a gaseous reactant supply means, or both must be moved. For example, a workpiece is rotated, or a rotary gas distributor is used as the gaseous reactant supply means.

The gaseous reactant of metal species for use in the present invention includes halides of Ti, Cr, Ni, Si, Al, Zr, B, Hf, V, W, Ta, etc.; the counterpart gaseous reactant includes $CH_4$, $C_2H_2$, $N_2$, silane, borane, etc., the ionization gas includes $N_2$, $H_2$, etc.; the carrier gas includes $H_2$, an inert gas such as Ar, etc. The reaction product containing the metal species as a film includes nitrides, carbides, and borides of these metal species. The gaseous reactants of these metal or semi-metal species can be used alone or in combination.

The workpiece for use in the present invention includes metallic materials such as iron, steel, etc., for example, chrome-molybdenum steel, hot rolled dies steel, etc.

In the present invention it has been found that when the selected portions of a workpiece are subjected to surface pretreatment, for example, carburizing, nitriding, boriding, sulfurizing or carburizing-nitriding before coating with the reaction product containing the metal species according to the CVD process using the secondary cathode, the adhesiveness of the reaction product to the workpiece can be further improved. That is, a combination of the surface pretreatment and the coating is preferable.

One example of coating procedure according to the present invention is outlined below:

(i) A workpiece and a secondary cathode are provided at appropriate positions in a glow discharge container.

(ii) The glow discharge container is exhausted to less than $10^{-1}$ Torr.

(iii) $H_2$ or $H_2+Ar$ is introduced into the glow discharge container to adjust the pressure to the necessary pressure of 0.1–10 Torr.

(iv) Direct current is applied to electrodes to generate glow discharge, provide sputtering and cleaning of the selected portions of the workpiece facing the secondary cathode and provide heating to the necessary temperature.

(v) CH₄ is introduced as a counterpart gaseous reactant into the glow discharge container, and the pressure inside the container is controlled to maintain the necessary temperature and form a carbon-rich layer on the selected portions of the workpiece.

(vi) A gaseous reactant of metal species, for example, TiCl₄, is introduced into the container, as dispersed in a carrier gas, for example, H₂, under a total pressure of not more than 10 Torr, a partial pressure of the gaseous reactant of metal pieces of not more than 0.5 Torr and a partial pressure of the counterpart gaseous reactant of not less than 0.5 Torr, and the total pressure is controlled with H₂ or Ar while keeping the amount of H₂ as the carrier gas constant to maintain the necessary temperature, and exposed to glow discharge for the necessary period of time, usually 0.5–10 hours.

(vii) Then, the supply of the gaseous reactant of metal species and the application of direct current are discontinued, and the glow discharge container is exhausted to less than $10^{-1}$ Torr and cooled.

In the present invention, the energy of glow discharge can be effectively utilized by making the temperature of a secondary cathode higher at the side facing a workpiece than at the opposite side. A plurality of coatings can be applied to a workpiece by exposing the workpiece to at least two different glow discharge conditions. Furthermore, a workpiece can be given portions having different functions by exposing at least two selected portions of the workpiece to different glow discharge conditions. Supply of gaseous reactants can be improved by using a secondary cathode having a discontinued surface, for example, with perforations, slits, etc., and the stagnation of the gaseous reactants in the clearance between the secondary cathode and the workpiece can be improved thereby.

The present invention will be described in detail, referring to the drawings.

BRIEF DESCRIPTION OF THE DRAWINGS

FIGS. 5(a), (b) and (c) are schematic views of the structure of a rotary gas distributor for uniformly distributing gaseous reactants.

The surface of an electroconductive workpiece is coated with a film. At first, the surface can be subjected to coating to directly form a film, but it is preferable to subject the surface to sputtering of atoms and infusion of the atoms from the surface to give surface pretreatment, for example, to give hardening, or other functions such as lubrication, corrosion resistance, fatigue resistance, etc. to the surface, and then to form a film. In the latter case, the amount of atoms to be infused or adsorbed, depth of infusion, etc. have desirable values to give such functions to the workpiece without any adverse effect, and in so far as the surface concentration can be kept constant, which generally depends upon the solid solution limit of workpiece, infusion or adsorption rate, etc., the temperature plays an important role. For example, in the case of surface hardening steel materials, 400°–700° C. is generally preferable for surface hardening with nitrogen, i.e. nitriding, 700°–100° C. for that with carbon, i.e. carburizing; 800°–1,200° C. for that with boron, i.e. boriding. On the other hand, the coating of a surface depends upon the metal species, but is usually in a range of 500° to 1,200° C. When an ultrahard coating layer of, for example, TiC, HfC, etc. is formed on the surface after the surface pretreatment of the surface of a workpiece, that is, after formation of a hard layer in advance, the resulting coated workpiece has a high resistance to deformation, a good duration, a good adhesiveness of the coating layer to the workpiece, etc.

There are appropriate temperature and time for the atoms for infusion or coating and for workpiece, as described above. To effectively elevate the surface temperature of a workpiece or locally heat the selected portion of a workpiece, an outside heat source can be used, but in the present invention, a secondary cathode having a substantially equal electric potential to that of a workpiece is provided at a position near enough to the surface of the workpiece to generate interactions of glow discharge therebetween, and the pressure, species, etc. of gases to be introduced during the coating are controlled, thereby carrying out reaction while generating the so-called hollow cathode effect between the secondary cathode and the workpiece. Heat to or from the workpiece is heat exchange of glow discharge energy, the heat of radiation from the workpiece, electrodes, etc., and the heat loss due to heat emission includes the heat of radiation, convection of gaseous reactants, heat conductance from electrodes, for example, loss through cooling water for the electrodes, etc. The hollow cathode effect is a kind of interactions of glow discharge generated by making two negative glow discharges approach each other to some specific distance, and produces a higher ionization density than in the other glow discharge zone, giving a higher temperature than in the other zone under a higher discharge voltage, though. Only the discharge energy between the secondary cathode and the workpiece and their mutual heat of radiation can be utilized for heating the selected portions of the workpiece to the necessary temperature, and this can be attained by generating the hollow cathode effect between two secondary cathodes or between a secondary cathode and a workpiece while providing the secondary cathodes at a specific distance and introducing gaseous reactants under specific partial pressures, thereby making the current density higher than in other glow discharge zone.

When a workpiece has a plurality of portions to be locally given different functions from the other, a plurality of secondary cathodes are provided in accordance with the required number of such portions, and then clearances, shapes, and material species are changed, and if necessary the species and the partial pressure of the gaseous reactants to be introduced are changed, whereby a plurality of portions having different functions can be obtained. These selected portions of a workpiece are heated and kept at a specific temperature by generating the hollow cathode effect between the secondary cathodes or between the secondary cathode and the workpiece according to a given condition. In that case, an ionization density of a gas is increased in a clearance between the workpiece and the secondary cathode or between the secondary cathodes, the desired surface reaction with the desired active atoms for infusion or coating is accelerated. To effectively obtain such phenomena, it is important to determine an appropriate distance from the surface of a workpiece to a secondary cathode, an appropriate distance between secondary cathodes with appropriate material, shape and surface area, and appropriate partial pressures of gaseous reactants. An appropriate distance from the surface of a workpiece to a secondary cathode, or an appropriate distance between secondary cathodes, must be the distance to generate interactions of negative glow between the workpiece and the secondary cathode or between the secondary cathodes, though dependent upon the partial pressures of gaseous reactants, because an effective clearance for interactions of negative glow depends upon the partial pressures of gaseous reactants and it gives a substantial effect upon the hollow cathode effect.

Figure 1:
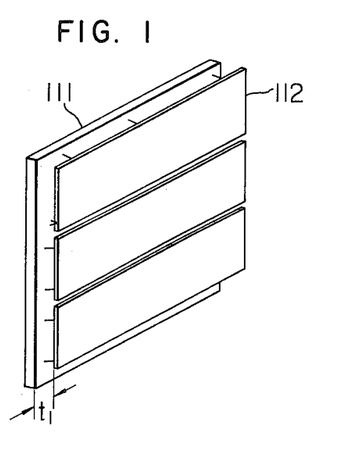
FIG. 1 is a schematic view of the structure of a secondary cathode for use in the present invention.

The shape and structure of secondary cathode closely related thereto are also important. In FIG. 1 the structure of plate-type secondary cathodes are shown, where a secondary cathode 111 is located at the anode side, and another secondary cathode is located at the workpiece side, and a distance $t_1$ between the secondary cathodes 111 and 112 is an important factor. Particularly, the secondary cathode 112 must have such a structure as to have a higher temperature than the secondary cathode 11. The hollow cathode effect must be generated between secondary cathodes 111 and 112 and between the secondary cathode 112 and a workpiece (not shown in the drawing).

Figure 2:
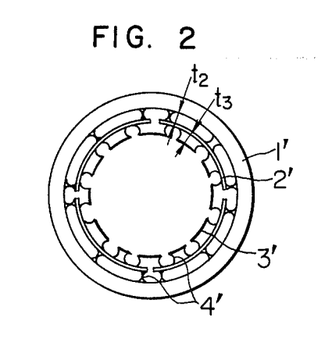
FIG. 2 is a cross-sectional view of the structure of another secondary cathode for use in the present invention.

The secondary cathodes can have a cylindrical form, as shown in FIG. 2, where a secondary cathode 2' or 3' is thinner than a secondary cathode 1', and can be provided in small pieces at the secondary cathode 1' by means of ribs 4', whereby a change in the hollow cathode effect by changes in distances between the secondary cathodes due to deformation that occurs by thermal expansion by heating based on the hollow cathode effect can be minimized. When the distance $t_2$ or $t_3$ between the secondary cathodes, or the distance between the secondary cathode 3' and a workpiece (not shown in the drawing) is less than 0.5 mm in the normal coating operation, the reaction of gaseous reactants and the consequent deposition of the reaction product onto the surface of the workpiece are liable to be interrupted, whereas, when the distance is more than 50 mm, the hollow cathode effect between the secondary cathodes or between the secondary cathode and the workpiece is hardly obtained, and also the heating effect due to the heat of radiation between the secondary cathodes or between the secondary cathode and the workpiece is lowered, and the process itself turns normal CVD process.

Figure 3:
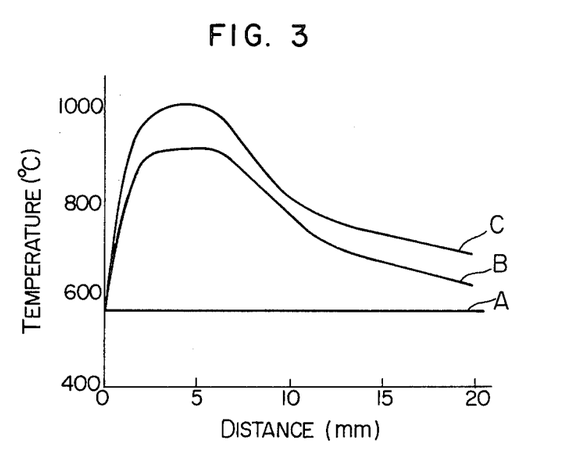
FIG. 3 is a diagram showing relations between a distance from a workpiece and a temperature particularly when a selected portion of a workpiece is coated according to one embodiment of the present invention.

When a workpiece, 15 mm in diameter and 50 mm in height, is subjected to the glow discharge generated under the total pressure of 3.5 Torr in a gas mixture of nitrogen, hydrogen, argon and methane with no secondary cathode, or with secondary cathodes of FIG. 1 and FIG. 2, where in FIG. 1 $t_1$ is kept to be 30 mm, whereas the distance between the secondary cathode 112 and the workpiece is changed, and in FIG. 2 $t_2$ is kept to be 10 mm, and $t_3$ is changed whereas the distance between the secondary cathode 3' and the workpiece is kept to be 8 mm, upon application of the same discharge voltage, temperature of workpieces is measured against the varied distances, and the results are given in FIG. 3, where the relations between the temperature and the distance are graphically shown. The temperature of workpiece obtained only by the conventional glow discharge with no secondary cathode is limited to 570° C. as shown by curve A, whereas the temperature is elevated to about 900° C. with the secondary cathodes of FIG. 1 at a distance of 2-7 mm by the generated hollow cathode effect, as shown by curve B, and the temperature follows curve C when the secondary cathodes of FIG. 2 are used. In other words, the temperature of the workpiece is by more than 300° C. higher in the hollow cathode effect zone than in the conventional glow discharge with no secondary cathode. The temperature difference greatly depends upon the total pressure of the atmospheric gas, partial pressures of gaseous reactants, species, shape, thickness of secondary electrode, etc. When a workpiece, 15 mm in diameter and 50 mm in height, is heated on the entire surface or at the selected portions thereof by the hollow cathode effect generated between the secondary cathodes and between the secondary cathode and the workpiece, it is seen from FIG. 3 that the appropriate distance for generating the hollow cathode effect is 0.5-15 mm, preferably 1.5-10 mm.

As regards the structure of secondary cathode, it has been found that when the secondary cathode at the anode side, for example, 111 in FIG. 1 or 1' in FIG. 2, which is thicker than the secondary cathode at the work piece side, for example, 112 in FIG. 1, or 2' or 3' in FIG. 2, is used in the same test as described above, the temperature difference between the secondary cathode and the workpiece becomes smaller with the same consumption power but with increasing thickness of the secondary cathode at the workpiece side, for example, 112 in FIG. 1 or 2' or 3' in FIG. 2, and thus it is desirable that the secondary cathode at the workpiece side has such a structure as to have a higher temperature than that of the secondary cathode at the anode side.

Figure 4:
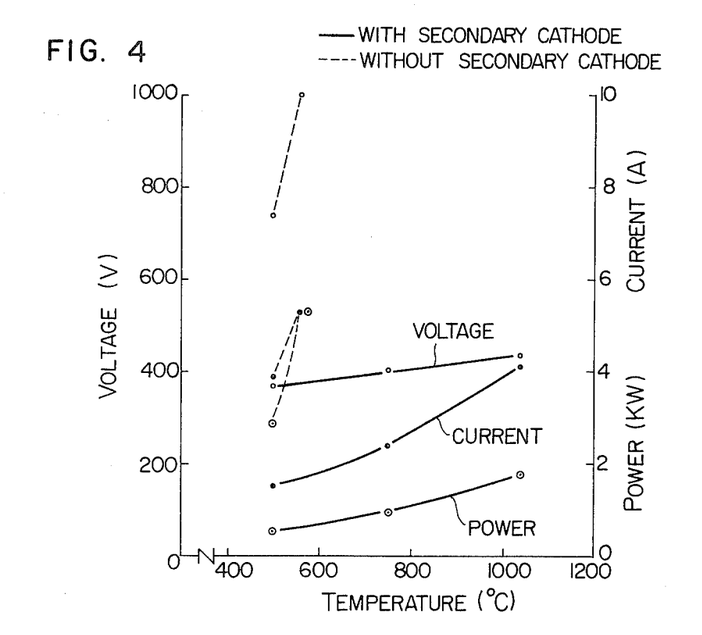
FIG. 4 is a diagram showing an effect of a secondary cathode upon heating.

The relations between the temperature of workpiece and the discharge voltage, current and power when an electroconductive workpiece, 50 mm in diameter and 90 mm in height, is subjected to glow discharge under a total pressure of 2.5 Torr under the same atmospheric gas conditions as above by disposing it concentrically in a thin hollow secondary cathode, 70 mm in diameter, are shown in FIG. 4, together with the case using no secondary cathode under the same conditions, where the full lines show relations between the temperature of workpiece and the discharge voltage, current and power of glow discharge according to the present invention using the secondary cathode, and the dotted lines show the similar relations when the same workpiece is heated only by conventional glow discharge using no secondary cathode under the same conditions as above. When no secondary cathode is used, the workpiece can be heated to a temperature of about 600° C. under a glow discharge voltage of 1,000 V, whereas in the case of using the secondary cathode according to the present invention, the workpiece can be heated to about 600° C. only under a glow discharge voltage of about 400 V. The glow discharge voltage necessary for heating the workpiece up to 1,000° C., which is sometimes required for a film formation, is less than 500 V according to the present invention. The necessary power for heating, more exactly a balance of total power from the power consumed in the discharge jigs, is less than a half of the power required for the conventional glow discharge without the secondary cathode. In other words, in the conventional glow discharge the necessary discharge voltage and power for the heating are considerably higher. Furthermore, the direction of discharge is considerably limited under a discharge voltage of 800 V or higher, and more readily electron-emitting edge parts of a workpiece are preferentially discharged than other parts, making the temperature distribution uneven over the workpiece. When coating with, for example, TiC, is carried out under such conditions, the thickness of the edge parts is considerably increased with coating, whereas coating of other parts is substantially not attained. Such tendency is more remarkable under increasing discharge voltage.

In the present invention, a higher temperature can be obtained on a workpiece under a lower discharge voltage by using a secondary cathode, and the necessary current and power can be reduced at the same time.

Figures 5A, 5B, 5C:
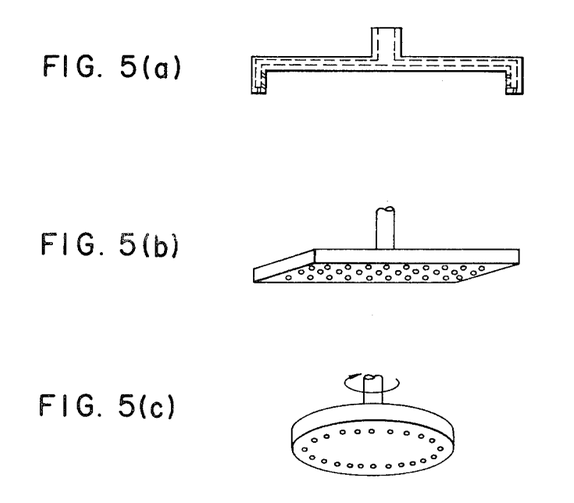
Figure 6:
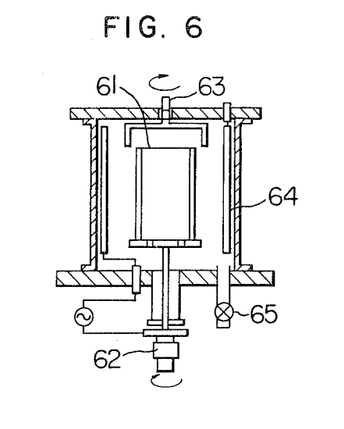
FIG. 6 is a schematic view of the structure of a rotary secondary cathode for uniformly carrying out reaction of gaseous reactants.

To uniformly distribute gaseous reactants onto the surface of a workpiece, a rotary gas distributor as shown in FIG. 5(a), (b) and (c) is used in the present invention, or a system of rotating a workpiece and a secondary cathode together as shown in FIG. 6 is used. In FIG. 6, a cylindrical hollow secondary cathode 61 is placed on a rotary cathode 62, and a workpiece (not shown in the drawing) is disposed inside the secondary cathode 61. A rotary gas distributor 63 is provided over the secondary cathode 61, and gaseous reactants are introduced into a clearance between the secondary cathode and the workpiece at many small nozzles at the down side of the rotary gas distributor through the hollow shaft thereof. Discharge voltage is applied to between an anode 64 and the rotary cathode while discharging the introduced through an exhausting outlet 65, to generate glow discharge and a hollow cathode efect between the secondary cathode 61 and the workpiece.

Figure 7:
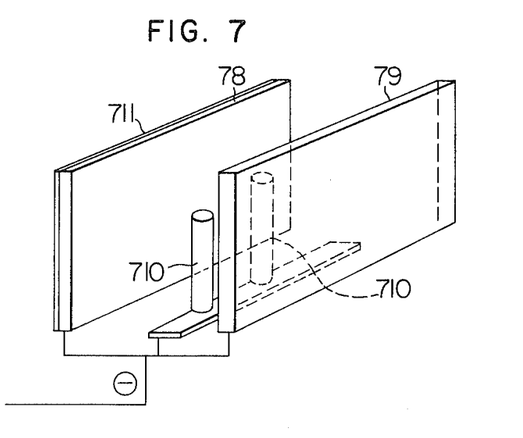
FIG. 7 is a schematic view of one embodiment of the structure in part of an apparatus for coating by glow discharge according to the present invention.

In FIG. 7, plate secondary cathodes 78 and 79 are juxtaposed, and electroconductive workpieces 710 are disposed between the secondary cathodes 78 and 79, where a heat-insulating ceramic layer 711 is provided at other side of the secondary cathode 78 than at the counter-facing side to reduce power consumption.

PREFERRED EMBODIMENT OF THE INVENTION

EXAMPLE 1

Figure 8:
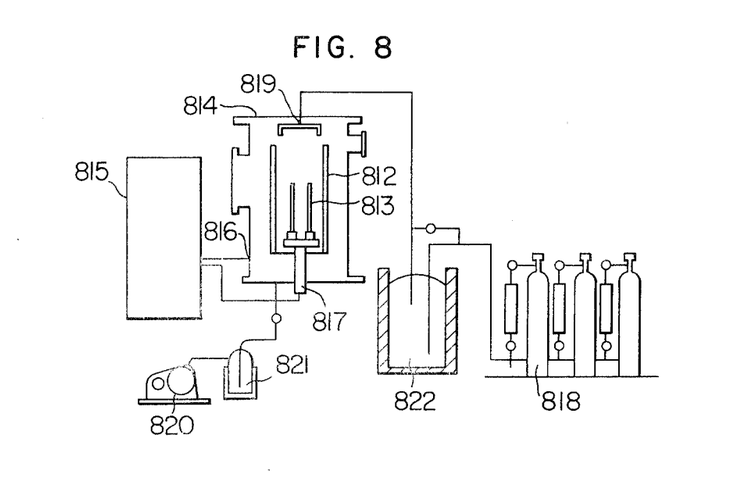
FIG. 8 is a schematic view of the structure of an apparatus for coating by glow discharge according to the present invention.

Coating with TiC was carried out in an apparatus for coating by glow discharge as shown in FIG. 8. Three workpieces were of hot-rolled dies steel (JIS SKD61 steel) in a staged shape of 20 mm in diameter and 50 in height and 7 mm in diameter and 30 mm in height. Plate secondary cathodes 812 were of stainless steel (JIS SUS304), 150 mm in width, 30 mm in length and 5 mm in thickness, and were juxtaposed at a distance of 50 mm, as shown in FIG. 8. The three workpieces 813 were disposed at the center between the secondary cathodes 812. In FIG. 8, numeral 814 is a reaction furnace, 815 a power source, 816 an anode terminal, 817 a cathode terminal, 818 gas cylinders, 819 a gas distributor, 820 a vacuum pump, 821 a trapper, and 822 a source for vaporizing a gaseous reactant of metal species.

Figure 9A:
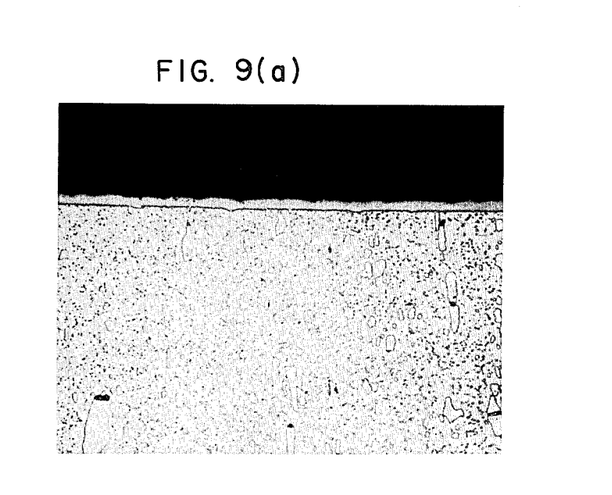
FIGS. 9(a) and (b) are microscopic pictures in 500 magnifications of metal structures of workpiece coated according to the present invention and the conventional method, respectively.
Figure 9B:
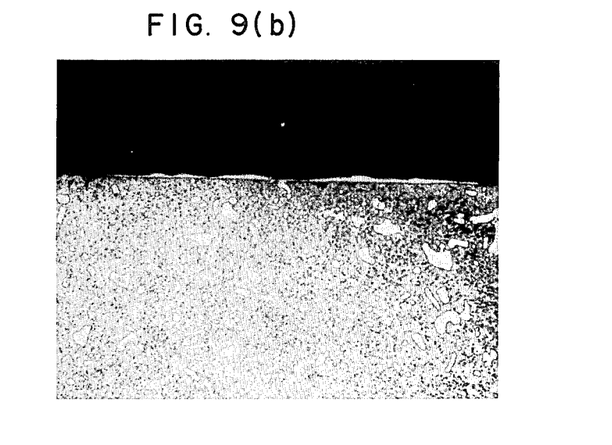

Coating was carried out in the following manner. The reaction furnace 814 was at first exhausted to $10^{-2}$ Torr by the vacuum pump 820, and then a gas mixture of $H_2$, $CH_4$ as a counterpart gaseous reactant, and Ar was introduced through the gas distributor 819 and a discharge voltage of 600 V was applied to the terminals 816 and 817 from the power source 815 to generate glow discharge at 900° C. for 10 minutes to carburize the surfaces of the workpieces as a surface pretreatment. Then, $TiCl_4$ as a gaseous reactant of metal species was mixed into the gas mixture and subjected to reaction at 930° C. for 30 minutes. The gas mixture had a $H_2$ partial pressure of 0.5 Torr, an Ar partial pressure of 0.90 Torr, a $CH_4$ partial pressure of 0.90 Torr and a $TiCl_4$ partial pressure of 0.11 Torr, and had a flow rate of 5.5 l/min. For comparison, the same workpieces were coated under the same conditions as above in the same apparatus as shown in FIG. 8 except that no secondary cathodes 812 were used. The workpieces coated according to the present invention had a uniform TiC film having a thickness of about 5 μm on the surface, as shown in FIG. 9 (a), whereas the conventional method using no secondary cathodes failed to obtain an equal temperature at the staged portion and the thus obtained workpieces had no uniform film even at the portion, 7 mm in diameter, though heated to 930° C., and had an uneven film as shown in FIG. 9(b).

When coating was carried out under the same conditions as above, using the secondary cathodes, except that a gas mixture having a $H_2$ partial pressure of 0.33 Torr, an Ar partial pressure of 0.67 Torr, and a $CH_4$ partial pressure of 0.67 Torr and a $TiCl_4$ partial pressure of 0.83 Torr was used at a gas flow rate of 7.5 l/min, a TiC coating was not obtained but a soft, soot-like coating.

EXAMPLE 2

Figure 10A:
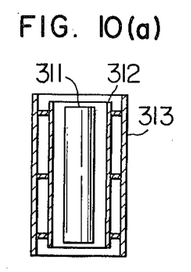
FIGS. 10(a), (b), (c), (d), and (e) are cross-sectional views of the structures of various secondary cathodes for use in the present invention.
Figure 10B:
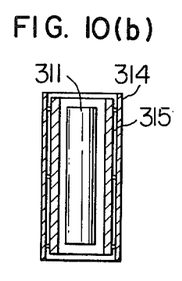
Figure 10C:
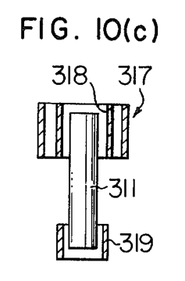
Figure 10D:
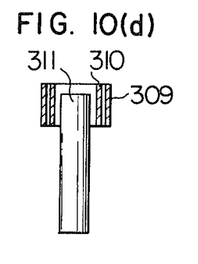
Figure 10E:
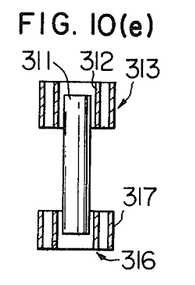

Test pieces shown in FIG. 10(a), (b), (c), (d) and (e) are disposed in the apparatus for coating by glow discharge as shown in FIG. 8. Workpiece 311 in FIG. 10 was chrome-molybdenum steel shafts according to JIS SCM415, 15 mm in diameter and 200 mm in length. In FIG. 10(a), secondary cathodes 312 and 313 were cylindrical and the distance therebetween was 8 mm, whereas the distance between the secondary cathode 312 and the workpiece 311 was 5 mm, and the hollow cathode effect was generated between the secondary cathode 312 and the workpiece 311. In FIG. 10(b), a secondary cathode 315 had a larger thickness than that of a secondary cathode 314, and a distance therebetween was 3.5 mm. The hollow cathode effect was generated therebetween. In FIG. 10(c), the hollow cathode effect was generated at the upper end and the lower end of the workpiece 311, that is, between the secondary cathodes 317 and 318 at the upper end, and between the secondary cathode 319 and the workpiece 311 at the lower end. In FIG. 10(d), a secondary cathode 310 had a larger thickness than that of a secondary cathode 309, and the hollow cathode effect was generated between the secondary cathodes 310 and 309. In FIG. 10(e), the hollow cathode was generated between secondary cathodes 312 and 313 at the upper end of the workpiece 311 and between the secondary cathodes 316 and 317 at the lower end of the workpiece 311. As a result, a temperature of 850°–950° C. was obtained by the hollow cathode effect in FIG. 10(a), at the upper and lower ends in FIG. 10(c), and at the upper end in FIG. 10(e); a temperature of 680°–700° C. in FIG. 10(b); a temperature of 670°–690° C. in FIG. 10(d); and a temperature of 650°–670° C. at the lower end in FIG. 10(e). Then, surface pretreatment of workpieces was conducted in a gas mixture of $CH_4$ as a counterpart gaseous reactant $+H_2+Ar$, and then $TiCl_4$ as a gaseous reactant of metal species was added to the gas mixture to carry out coating of the workpieces for 30 minutes. The gas mixture had a $H_2$ partial pressure of 0.77 Torr, an Ar partial pressure of 0.70 Torr, a $CH_4$ partial pressure of 0.94 Torr and a $TiCl_4$ partial pressure of 0.07 Torr and a gas flow rate of 5.3 l/min. Then, the workpieces were quenched.

Figure 11:
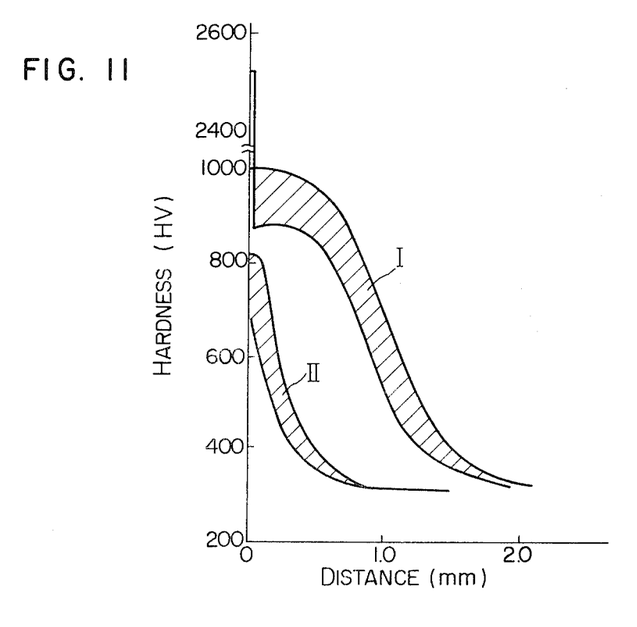
FIG. 11 is a diagram showing relations between the surface hardness of workpieces and distances between workpieces and secondary cathodes according to the present invention.

In FIG. 11, distribution of hardness on the workpieces after the coating is shown, where the hardness at the other parts than the coating on the surface is, when heated above 850° C., in the range shown by I and, otherwise, in the range shown by II. In the zone where the carburization as a surface pretreatment was uniformly carried out by heating above 850° C., TiC coating was formed on the surface, as in Example 1.

It is seen from the foregoing that the hollow cathode effect generated between the secondary cathodes and between the secondary cathode and the workpiece is very effective for the surface pretreatment and coating.

Figure 12:
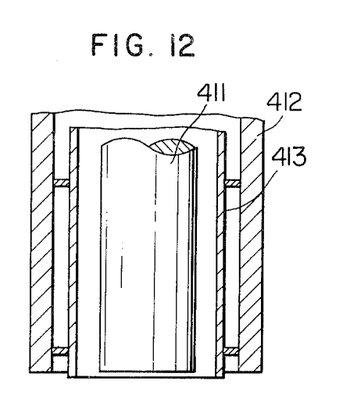
FIG. 12 and FIG. 13 are cross-sectional views of the structure of secondary cathodes for use in the present invention.

In FIG. 12, an embodiment of a secondary cathode is shown. When a rod workpiece 411, 20 mm in diameter and 200 mm in length, was placed in an apparatus for coating as shown in FIG. 8 with a cylindrical secondary cathode 412, 26 mm in inner diameter, 150 mm in length, and 3 mm in thickness, or further together with an inner secondary cathode 413, 36 mm in inner diameter and 5 mm in thickness, as shown in FIG. 12, or with a cylindrical inner secondary cathode 115, 26 mm in inner diameter, and 3 mm in thickness with perforations, 1 mm, 2 mm or 3 mm in size, on the entire surface, or further together with an outer secondary cathode 416, 36 mm in inner diameter and 5 mm in thickness, as shown in FIG. 13, or without any of these secondary cathodes, and the workpiece 411 was kept at a temperature of 580° C. at the portions facing no secondary cathode by means of a gas mixture of nitrogen, hydrogen, argon and methane, and the temperature of the workpiece at the portion facing the secondary cathode was measured while changing the total pressure of the gas mixture.

Figure 13:
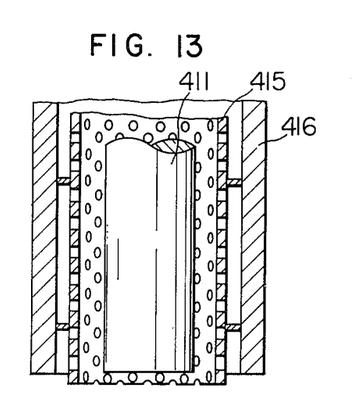
Figure 14:
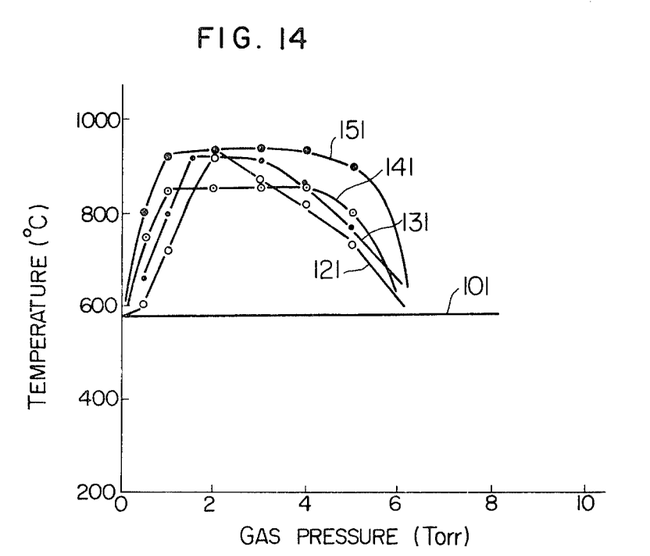
FIG. 14 is a diagram showing relations between a gas pressure and a temperature particularly according to the present invention.

In FIG. 14, relations between the total gas pressure and temperature are shown. To conduct stable surface treatment, it is desirable that the temperature of a workpiece is not greatly changed even by slight change in total gas pressure. The temperature of a workpiece without any secondary cathode was kept at 580° C., whereas a higher temperature was obtained with a single secondary cathode within a relatively narrow total pressure range only within the range of generating the hollow cathode effect between the workpiece and the secondary cathode as shown by curve 121 in FIG. 14. With further use of another secondary cathode, the hollow cathode effect was generated between the secondary cathodes 412 and 413 of FIG. 12 and took curve 131 in FIG. 14, and a higher temperature was obtained with a broad total gas pressure range. On the other hand, when the secondary cathode had regular perforations of 1 mm, 2 mm or 3 mm in size as shown in FIG. 13, a broader high temperature level range was obtained in a broader total gas pressure range, though the temperature level was lowered as shown by curve 141 in FIG. 14. In that case, the hollow cathode effect was generated in the perforations in the secondary cathode according to changes in the total gas pressure, whereby the total gas pressure range was broadened for the hollow cathode effect between the secondary cathode and the workpiece. When another secondary cathode 416 was provided at the outside of the perforated secondary cathode 415 as shown in FIG. 13, the temperature level range took the curve 151 of FIG. 14, where the maximum temperature level was elevated and the total gas pressure range for maintaining the high temperature level range was further broadened. The total gas pressure range for maintaining the maximum temperature and the broader high temperature level range greatly depended upon the shape and structure of the secondary cathode and the composition of gas mixture.

The secondary cathodes having perforations, 0.5–3 mm, 4 mm, 5 mm, 6 mm, 7 mm, 8 mm, or 9 mm in size, were investigated as the structure of the secondary cathode shown in FIG. 13, and it was found that, when the perforation size was larger than 4 mm, the maximum temperature level was sharply lowered, and when it was 8 mm or larger, the hollow cathode effect was considerably lowered. The most effective perforation size was 0.5–4 mm in diameter, but the perforation size of 0.5–7 mm could had the effect to some degree. In place of the perforation, slits, 20 mm in length, were provided in the secondary cathode. When the slits had a width of not more than 4 mm, the discharge based on the hollow cathode effect was likewise obtained in the slits. A ceramic layer was provided at the outside of the outer secondary cathode in the foregoing test. When a ceramic layer was provided at the outside of the outer secondary cathode in FIG. 13, the power could be about 10% reduced.

EXAMPLE 3

Workpieces of JIS SKD1, 15 mm in length, 15 mm in width and 120 mm in height were used. The three workpieces were coated with two kinds of secondary cathodes as shown in FIGS. 12 and 13, with a gas mixture of hydrogen, argon, methane as a counterpart gaseous reactant, and $CrCl_2$ as a gaseous reactant of metal species having a $H_2$ partial pressure of 1.21 Torr, an argon partial pressure of 0.56 Torr, a $CH_4$ partial pressure of 1.13 Torr and a $CrCl_2$ partial pressure of 0.08 Torr and a gas flow rate of 5.3 l/min. in the same manner as in Example 1. It was found that uniform chromium carbide films having a thickness of 7–10 μm were formed at the portions of workpieces where the hollow cathode effect was generated.

EXAMPLE 4

Workpieces, 20 mm in diameter and 30 mm in height, of WC material JIS 420 and stainless steel JIS SUS 304 were placed at the center in each of graphite secondary cathodes, 36 mm in inner diameter and 5 mm in thickness in an apparatus for coating by glow discharge as shown in FIG. 8. The reaction furnace was exhausted to $10^{-3}$ Torr, and a gas mixture of $H_2 + 5\%$ Ar was introduced into the reaction furnace at such a gas flow rate to make the total gas pressure of 3 Torr. Then, direct current was applied to the terminals under 800 V. The hollow cathode effect was generated between the workpiece and the secondary cathode, and the workpiece was heated to 950° C. over about 15 minutes. Then, 30% by volume of nitrogen as a counterpart gaseous reactant was added to the gas mixture of $H_2 + 5\%$ Ar on the basis of the gas mixture, and the flow rate of $H_2 + 5\%$ Ar was controlled to keep the temperature at 950° C. The nitriding surface pretreatment of the workpiece was carried out for about 10 minutes while adjusting the total gas pressure to 3 Torr. The jig for setting the secondary cathode and the workpiece on the whole was rotated at 1 rpm at the same time when the nitrogen was added to the gas mixture. Then, $TiCl_4$ as a gaseous reactant of metal species was added at a flow rate of a half of the nitrogen gas flow rate to the gas mixture, while keeping the total gas pressure at 3 Torr. The temperature was kept at 950° C. by controlling the flow rate of $H_2 + 5\%$ Ar and the workpiece was subjected to coating for 30 minutes. During the coating, the jig was rotated at 3 rpm. After cooling, the cross-section of the structures of the coated workpieces was observed, and it was found that a TiN films having a thickness of 5 to 10 μm was formed at portions of workpieces provided with the secondary cathodes.

Same surface treatment was carried out under the same conditions as above, without turning the jig. As a result, it was found that the thickness of the TiN films thus formed differed in distance from the position of the gas distributor. That is, the TiN films having a thickness of 3–7 μm were formed on the workpieces near the gas distributor, but the films were not substantially formed at positions remote from the gas distributor.

Figure 15:
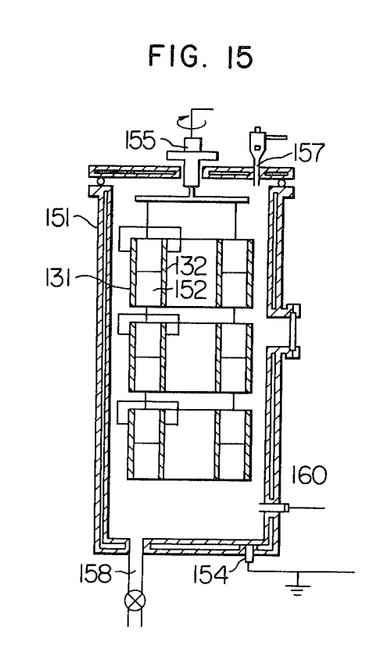
FIG. 15 is a view of an arrangement for coating a plurality of workpieces by means of a plurality of secondary cathodes according to the present invention.
Figure 16A:
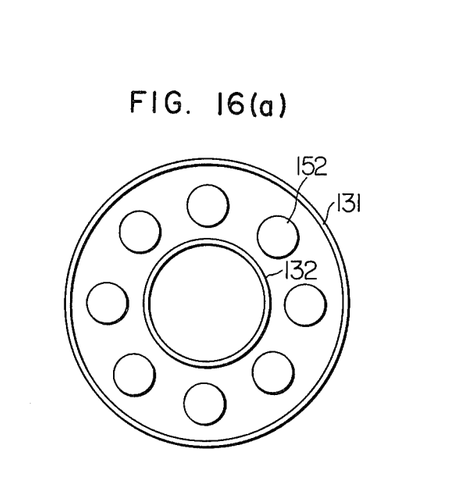
FIG. 16(a) and (b) are cross-sectional view in detail of FIG. 15 and its vertical cross-sectional view, respectively.

Embodiments of arranging a plurality of workpieces according to the present invention are shown in FIGS. 15, 16(a) and (b) and 17.

Figure 16B:
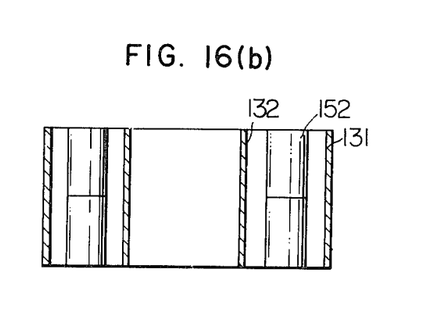

In FIGS. 15, and 16(a) and (b), a plurality of workpieces 152 were in a concentric line between an inner secondary cathode 132 and outer secondary cathode 131, these secondary cathodes being in a concentrical position in an apparatus 151 for coating by glow discharge, where the secondary cathodes 131 and 132 rotate together with the workpieces 152. Numeral 154 is an anode terminal, 155 a cathode terminal, 157 a gas inlet, 158 a gas outlet connected to a vacuum pump, and 160 a vacuum gage terminal.

Figure 17:
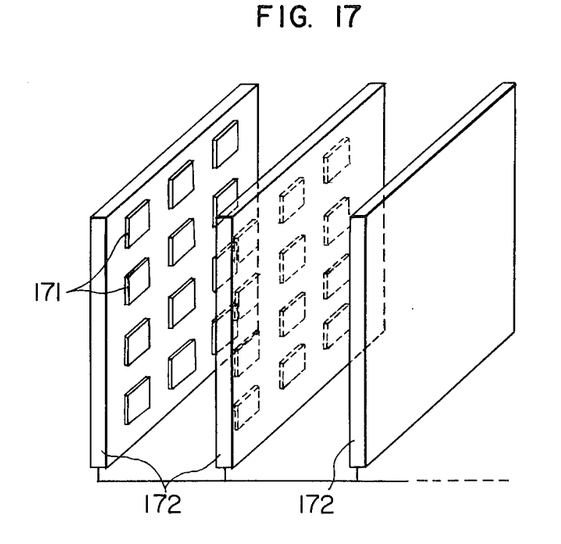
FIG. 17 is a schematic view of an arrangement for coating a plurality of plate workpieces at the same time with secondary cathodes serving also as jigs for the workpieces.

In FIG. 17, a plurality of plate workpieces 171 are arranged on jigs 172 serving as secondary cathodes at the same time.

What is claimed is:

1. A method for coating an electroconductive workpiece by glow discharge, which comprises reacting a gaseous compound of a metal species or a semi-metal species with another gaseous substance capable of forming a reaction product containing the metal or semi-metal species by reaction with said gaseous compound, under a total pressure of not more than 10 Torr, the partial pressure of said gaseous compound being not more than that of said gaseous substance, said reacting being carried out by the glow discharge generated between an electroconductive workpiece connected to a cathode, at least one secondary cathode positioned near enough to the workpiece to generate interactions of glow discharge between at least selected portions of the workpiece and the at least one secondary cathode, and an anode, thereby coating said at least selected portions of the workpiece with said reaction product.

2. The method according to claim 1, wherein the partial pressure of said gaseous compound is not more than 0.5 Torr, and that of said gaseous substance is not less than 0.5 Torr.

3. The method according to claim 1, wherein an ionization gas and a carrier gas are present during said reacting.

4. The method according to claim 3, wherein the ionization gas is nitrogen gas or hydrogen gas and the carrier gas is at least one member of the group consisting of argon gas and hydrogen gas.

5. A method for coating an electroconductive workpiece by glow discharge, which comprises reacting a gaseous compound of a metal species or a semi-metal species with another gaseous substance capable of forming a reaction product containing the metal or semi-metal species by reaction with said gaseous compound, under a total pressure of not more than 10 Torr, and the partial pressure of said gaseous compound being not more than that of said gaseous substance, said reacting being carried out by the glow discharge generated between an electroconductive workpiece connected to a cathode, at least one secondary cathode positioned near enough to the workpiece to generate interactions by glow discharge between at least selected portions of the workpiece and the at least one secondary cathode, and an anode, while relatively moving the supply direction of said gaseous compound of the metal or semi-metal species and the workpiece during the reaction, thereby making uniform contact of said gaseous compound of a metal or a semi-metal species with the workpiece and thereby coating said at least selected portions of the workpiece with said reaction product.

6. The method according to claim 5, wherein the workpiece is rotated.

7. The method according to claim 5, wherein said gaseous compound of metal species is supplied to said at least selected portions of the workpiece through a rotary gas distributing means.

8. The method according to claim 1 or 5, wherein said gaseous compound and said gaseous substances are continuously supplied between the at least one secondary cathode and the workpiece while continuously withdrawing the resulting reaction gas from therebetween, thereby preventing stagnation of the resulting reaction gas therebetween.

9. The method according to claim 1 or 5, wherein the total pressure is 2-7 Torr.

10. A method for coating an electroconductive workpiece by glow discharge, which comprises pretreating selected portions of an electroconductive workpiece and then reacting a gaseous compound of a metal species or semi-metal species with another gaseous substance capable of forming a reaction product containing the metal of semi-metal species by reaction with said gaseous compound, under a total pressure of not more than 10 Torr, the partial pressure of said gaseous compound being not more than that of said gaseous substance, said reacting being carried out by the glow discharge generated between the workpiece connected to a cathode, at least one secondary cathode positioned near enough to the workpiece to generate interactions of glow discharge between at least selected portions of the workpiece and the at least one secondary cathode, and an anode, thereby coating said at least selected portions of the workpiece with said reaction product.

11. The method according to claim 10, wherein the pretreatment is carburizing, nitriding, boriding, sulfurizing or carburizing-nitriding.

12. The method according to claim 1, 5 or 10, wherein said gaseous compound is a halide of Ti, Cr, Ni, Si, Al, Zr, B, Hf, V, W, or Ta, said gaseous substance is $CH_4$, $N_2$, silane or borane, and the reaction product as a coating is a nitride, carbide or boride of Ti, Cr, Ni, Si, Al, Zr, B, Hf, V, W or Ta.

13. The method according to claim 1, 5 or 10, wherein said at least one secondary cathode substantially surrounds the at least selected portions of the workpiece.

14. The method according to claim 1, 5 or 10, whereby a plurality of secondary cathodes are utilized and positioned to generate interactions by glow discharge between the secondary cathodes and between the secondary cathodes and the workpieces.

15. The method according to claim 1, 5 or 10, wherein said at least one secondary cathode has a discontinuous surface.

16. The method according to claim 15, wherein said discontinuous surface includes perforations, with said perforations having a size of 0.5-7 mm in diameter.

17. The method according to claim 1, 5 or 10, wherein said at least one secondary cathode is positioned to provide interactions of glow discharge around the workpiece, thereby coating the workpiece with the resulting reaction product.

* * * * *